United States Patent
Cheng et al.

(10) Patent No.: US 7,153,738 B2
(45) Date of Patent: Dec. 26, 2006

(54) METHOD FOR MAKING A TRENCH MEMORY CELL

(75) Inventors: Kangguo Cheng, Beacon, NY (US); Brian Messenger, Newburgh, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/908,617

(22) Filed: May 19, 2005

(65) Prior Publication Data

US 2006/0263975 A1    Nov. 23, 2006

(51) Int. Cl.
*H01L 21/8242* (2006.01)
(52) U.S. Cl. .................. 438/248; 438/391; 438/738
(58) Field of Classification Search ................ 438/243, 438/248, 386, 391, 737, 738
See application file for complete search history.

(56) References Cited

U.S. PATENT DOCUMENTS

| 6,110,792 | A * | 8/2000 | Bronner et al. ............ 438/386 |
| 6,284,665 | B1 * | 9/2001 | Lill et al. .................. 438/710 |
| 6,310,375 | B1 | 10/2001 | Schrems |
| 6,326,658 | B1 | 12/2001 | Tsunashima et al. |
| 6,828,191 | B1 | 12/2004 | Wurster et al. |
| 6,838,334 | B1 * | 1/2005 | Gluschenkov et al. ...... 438/243 |
| 6,852,590 | B1 * | 2/2005 | Tsai et al. .................. 438/243 |
| 2004/0031992 | A1 | 2/2004 | Davis et al. |

* cited by examiner

*Primary Examiner*—M. Wilczewski
*Assistant Examiner*—Toniae M. Thomas
(74) *Attorney, Agent, or Firm*—Yuanmin Cai

(57) ABSTRACT

A process is provided for forming a trench capacitor, such as used in a DRAM memory cell, in which the required number of polysilicon deposition steps and planarization steps are reduced. A first region of a first material is formed in the bottom portion of the trench, and a dielectric material for the collar structure is subsequently formed above this region on a portion of the trench sidewalls. A removable material, such as a resist or spin-on glass, is then provided in the trench, overlying the first material and in contact with the lower portion of the collar dielectric material. The upper portion of the collar structure is then removed, after which the removable material is removed to again expose the upper surface of the first region. A second region of a second material, overlying and in contact with the first region, is then formed; the second region has an upper surface below the surface of the substrate. The first and second materials are conducting materials, typically polysilicon. The capacitor thus may be formed with only two polysilicon deposition processes; the interface between the first and second materials is the only interface between conducting materials in the trench.

16 Claims, 5 Drawing Sheets

METHOD FOR MAKING A TRENCH MEMORY CELL

FIELD OF THE INVENTION

This invention relates to semiconductor device manufacturing, particularly DRAM memory cells which include a trench capacitor and buried strap. More particularly, the invention relates to a simplified process for forming the trench capacitor.

BACKGROUND OF THE INVENTION

The ongoing reduction in size of electronic device elements, particularly memory devices, has led to the development of DRAM cells in which a typical cell comprises a transistor connected to a trench capacitor (that is, a capacitor formed in a trench etched into the substrate so as to consume minimal substrate surface area). Trench capacitors generally have an insulator (usually nitride or oxynitride) on the bottom and adjacent sidewalls of the trench serving as the capacitor dielectric, and regions of conductive doped polysilicon filling the trench serving as the capacitor plates or nodes.

Steps in a conventional process for forming a trench capacitor are shown in FIGS. 1A–1H. A trench 10 is etched into the substrate 1 (FIG. 1A); at this point in the overall device fabrication process, the substrate surface 5 is typically covered by a pad insulator 2 such as silicon nitride. A node dielectric 3 is deposited on the sidewalls and bottom of the trench and on top of the pad insulator 2. A layer of polysilicon 21 is deposited on this dielectric, thereby covering the top surface 11 of the pad insulator and filling the trench. The polysilicon is etched so that it is recessed in the trench; the node dielectric 3 is then removed from the top surface 11 and the upper sidewall 12 of the trench. The recessed polysilicon (forming a node at the bottom of the trench) and node dielectric thus appear as shown in FIG. 1B. Another dielectric layer 4 (typically oxide) is deposited on the top surface 11, the trench sidewalls 12 and the top surface 26 of the node polysilicon; this layer is etched so as to leave a collar in the interior of the trench on the upper sidewalls 12 (FIG. 1C). A second polysilicon deposition is performed to fill the trench and cover the surface 11; this polysilicon 22 is then polished (typically by chemical-mechanical polishing or CMP) so that it is coplanar with surface 11 (FIG. 1D). Polysilicon 22 is subsequently etched so that it is recessed in the trench (FIG. 1E). The collar 4 is then etched so that the top portion of the trench sidewall is again exposed (FIG. 1F). A third polysilicon deposition is performed, followed by planarization (FIG. 1G) and another etch process so that polysilicon 23 is recessed below the substrate surface 5 (FIG. 1H).

The trench capacitor structure 30 is subsequently covered at its top surface 25 by the shallow trench isolation (STI) 40, which also overlaps a portion of the trench capacitor as shown in FIG. 2. A CMOS transistor 50 having gate 51, source 52 and drain 53 is formed adjacent to the trench capacitor. A buried strap region 55 (formed by diffusion of dopants from polysilicon 22) connects the source 52 with polysilicon 23. The junction between polysilicon 23 and the buried strap 55 is called the buried strap junction. The collar 4 serves to prevent charge leakage from the capacitor at the buried strap junction.

As outlined above, the conventional process for forming a trench capacitor requires three polysilicon deposition steps, three polysilicon recess steps, and at least two planarization steps. This is a complicated and costly process, particularly with present-day 300 mm diameter substrates. The depositions typically are performed in a furnace and require long process times; the CMP planarization presents significant process control challenges when 300 mm substrates are used. In addition, the formation of three polysilicon regions 21, 22, 23 in the trench capacitor creates two polysilicon/polysilicon interfaces 31, 32 within the trench, resulting in increased internal resistance in the polysilicon; an increase in polysilicon resistance will in turn reduce device speed. There is a need for a trench capacitor formation process which requires fewer steps and can be practiced at lower cost, and preferably provides improved device performance.

SUMMARY OF THE INVENTION

The present invention addresses the above-described need by providing a simplified process for forming a trench capacitor, in which the required number of polysilicon deposition steps and planarization steps are reduced. In accordance with the present invention, this is done by using a removable material in the process of forming the collar structure; the removable material may be resist or spin-on glass. A first region of a first material is formed in the bottom portion of the trench. A collar structure of dielectric material is subsequently formed above this region on a portion of the trench sidewalls. The removable material is then provided in the trench, overlying the first material and in contact with the lower portion of the collar. The upper portion of the collar is then removed, after which the removable material is removed to again expose the upper surface of the first region. The upper portion of the collar and the adjacent portion of the removable material may advantageously be removed in the same process, such as a RIE process.

A second region of a second material, overlying and in contact with the first region, is then formed; the second region has an upper surface below the surface of the substrate. The materials in the first and second regions are conducting materials, typically polysilicon. The first region includes a dielectric layer (the node dielectric) at the bottom and lower walls of the trench. The second region typically extends above the collar structure and is in contact with a conducting region of the substrate at a sidewall of the trench; this conducting region is electrically connected to a transistor, so that the trench capacitor and the transistor form a DRAM cell.

In accordance with another aspect of the invention, a method is provided for forming a DRAM cell. This method includes forming a capacitor structure having two regions of polysilicon in the trench by a process including not more than two polysilicon deposition steps; the first polysilicon deposition step is performed before forming the dielectric collar, and the second deposition step is performed after forming the dielectric collar.

According to a further aspect of the invention, a capacitor structure is provided which includes a first region, including a dielectric layer and a first conducting material, in a bottom portion of the trench; a collar structure of a dielectric material on the sidewalls of the trench above the first region; and a second region, extending above the collar structure, including a second conducting material in contact with the first conducting material at an interface between the first region and the second region. The first material and the second material typically are polysilicon. The collar structure has a lower end disposed on a previously formed upper surface of the first region, so that the collar structure is

DETAILED DESCRIPTION OF PREFERRED EMBODIMENTS OF THE INVENTION

In accordance with the invention, a removable material is deposited on the node polysilicon 21 in the trench, and is subsequently removed. This permits the trench capacitor to be formed with two polysilicon deposition steps instead of three, as detailed below.

First Embodiment

Deposition and Removal of Resist

Figure 1A:
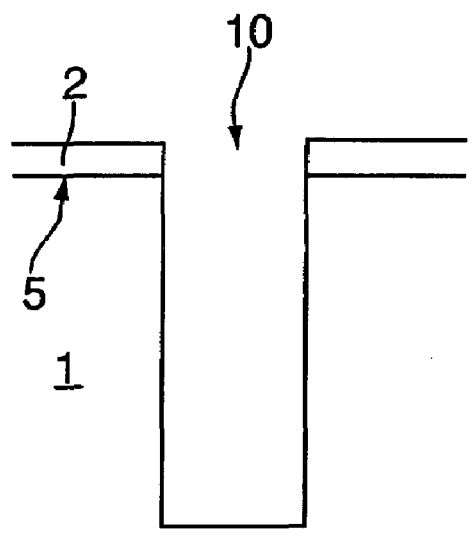
FIGS. 1A–1H illustrate steps in a conventional process for forming a trench capacitor for a DRAM cell.
Figure 1B:
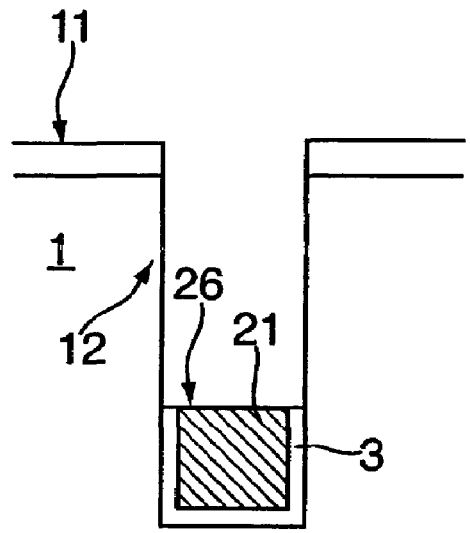
Figure 1C:
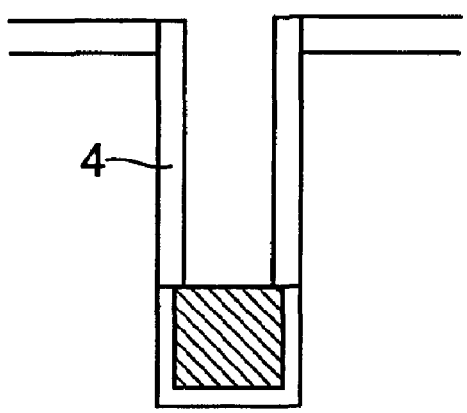
Figure 1D:
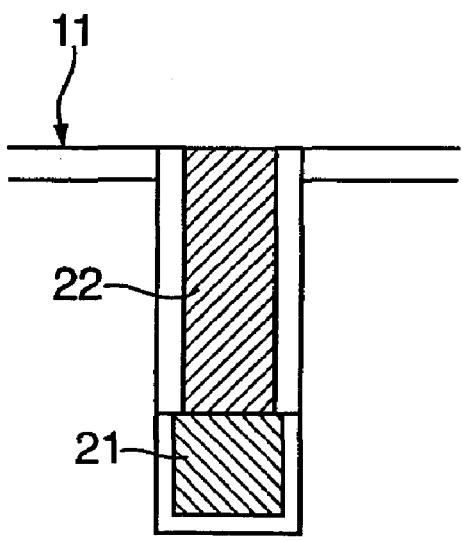
Figure 1E:
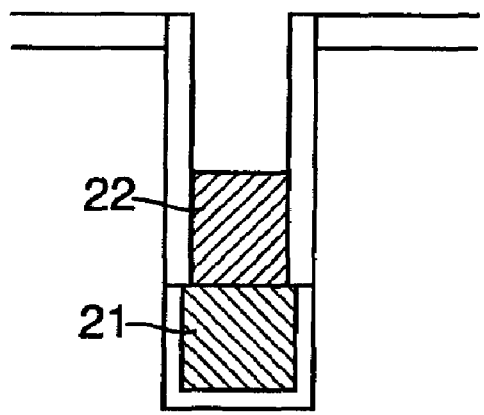
Figure 1F:
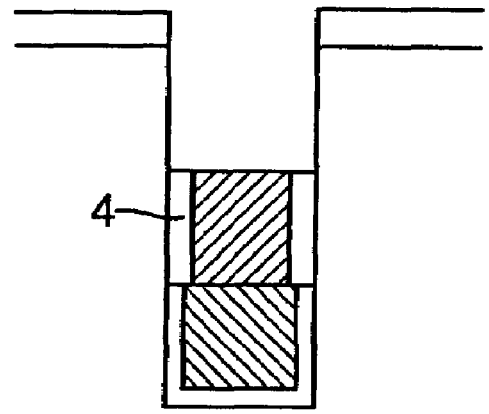
Figure 1G:
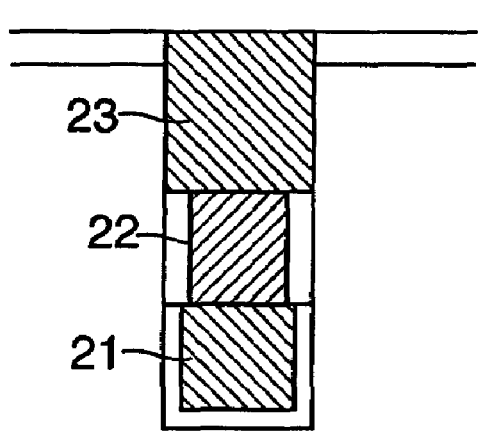
Figure 1H:
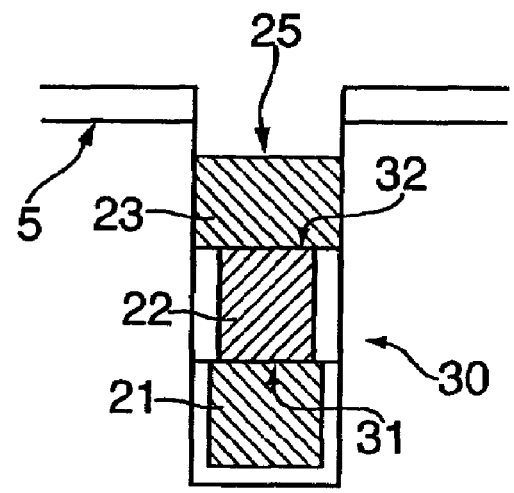
Figure 4:
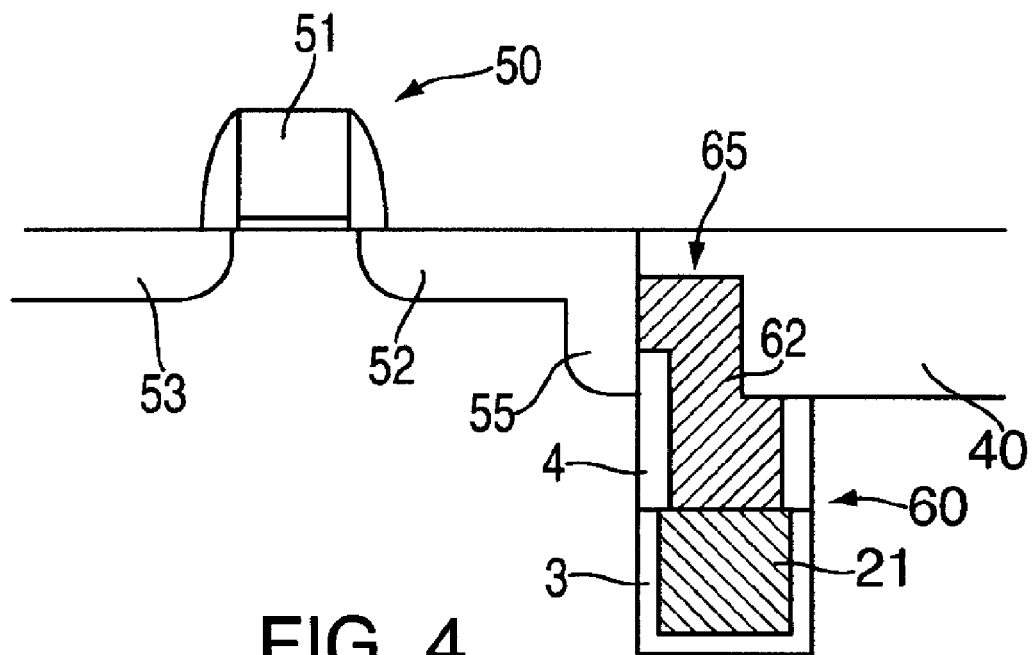
FIG. 4 schematically illustrates a completed DRAM cell including a transistor and trench capacitor, with the trench capacitor formed in accordance with the invention.
Figure 3A:
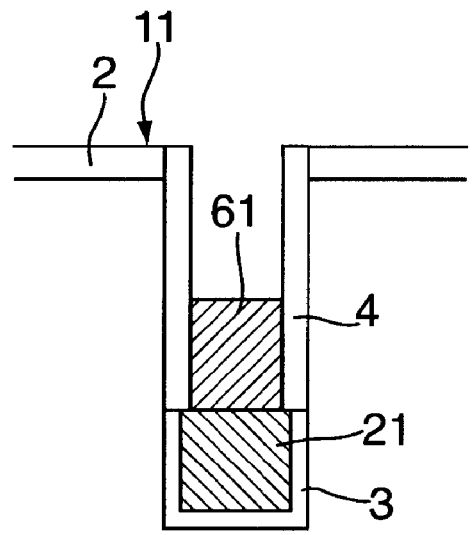
FIGS. 3A–3D illustrate steps in a simplified process for forming the trench capacitor, in accordance with a first embodiment of the invention.
Figure 3B:
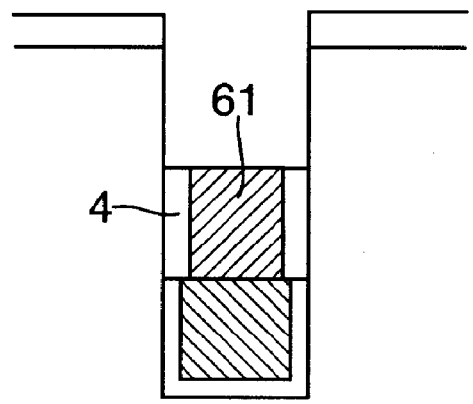
Figure 3C:
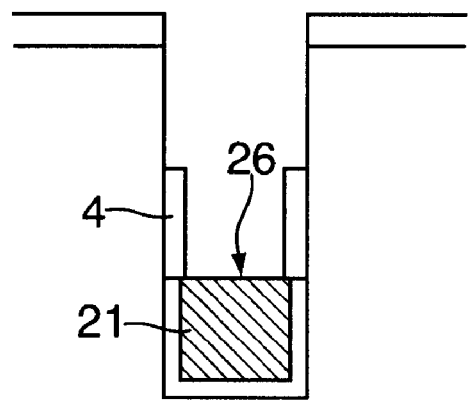
Figure 3D:
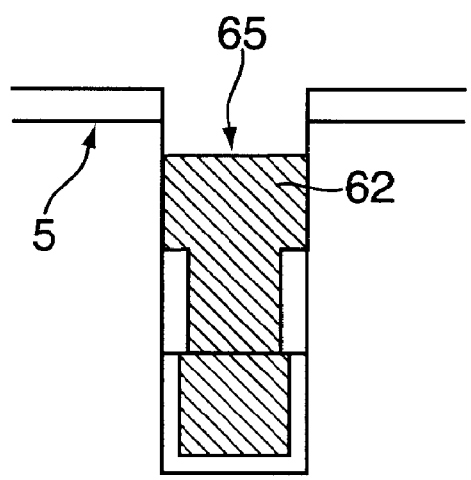

In this embodiment, the trench capacitor formation process begins as shown in FIGS. 1A–1C. A trench is etched in the substrate; node dielectric 3 and the node polysilicon 21 are deposited (typically as a blanket layer); the node polysilicon is recessed in the trench; and the collar 4 is formed on the upper sidewalls of the trench. Since the collar is formed after deposition of the polysilicon 21, the lower end of the collar is self-aligned to the upper surface of the polysilicon 21. Resist 61 is deposited on the substrate and inside the trench on top of node polysilicon 21, so as to fill the trench; this resist is then partially etched away so that it is removed from the top surface 11 and recessed inside the trench (FIG. 3A). The recess process exposes the upper portion of the collar 4, while the lower portion of the collar is still covered by the resist. The collar is then etched so that the top edge of the collar is coplanar with the top surface of resist 61 (FIG. 3B). The resist is then stripped, so that the top surface 26 of node polysilicon 21 is again exposed (FIG. 3C). A second polysilicon deposition process is then performed, so that polysilicon 62 covers the substrate and fills the trench. This polysilicon is planarized and etched so that it is removed from the top surface and recessed within the trench, as shown in FIG. 3D. The STI 40 is then formed, covering the top surface 65 of polysilicon 62 and overlapping the upper portion of the trench capacitor, as shown in FIG. 4. The transistor 50 is subsequently formed, along with buried strap 55 connecting the upper portion of polysilicon 62 with source region 52 of the transistor. A completed DRAM cell in accordance with this embodiment is shown in FIG. 4.

Second Embodiment

Deposition and Removal of Spin-on Glass

Figure 5A:
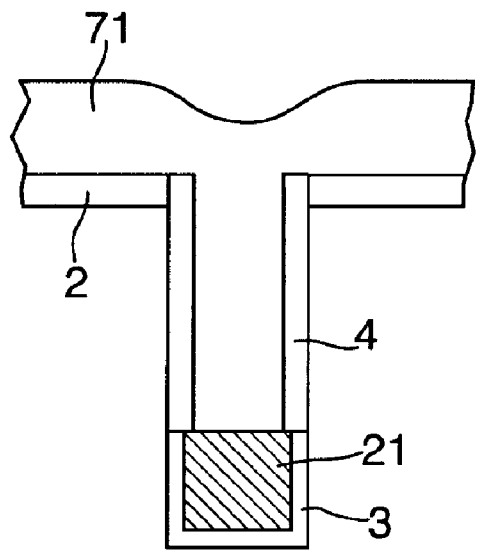
FIGS. 5A–5D illustrate steps in a simplified process for forming the trench capacitor, in accordance with a second embodiment of the invention.
Figure 5B:
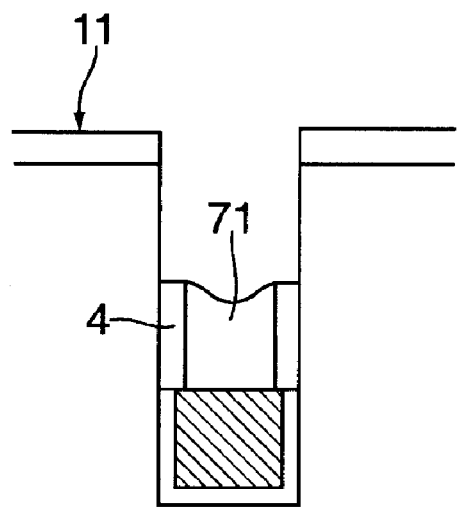

In a second embodiment of the invention, spin-on glass (SOG) is used as the removable material. The process again begins with formation of the trench, deposition of the node dielectric 3 and node polysilicon 21, recessing of the node dielectric and node polysilicon, and formation of the collar 4 (see FIGS. 1A–1C). Spin-on glass 71 is then applied, covering the substrate and filling the trench (FIG. 5A). An etch process, preferably a reactive-ion etch (RIE) process, is performed to remove the SOG from the top surface 11, and then etch the collar 4 and the SOG 71 simultaneously in the trench. The collar oxide and the SOG have similar etch rates in the RIE process, so that they are recessed in the trench approximately the same amount (see FIG. 5B). An example of such a process is a RIE process using $C_5F_8$, $C_4F_6$ and/or $CF_4$ chemistry, in which the collar oxide and the SOG can be etched with virtually the same etch rate. This embodiment thus offers an advantage by recessing the collar and SOG simultaneously; the step of etching the collar after recessing the filling material in the first embodiment is eliminated. This simplifies the process and reduces the cost.

Figure 5C:
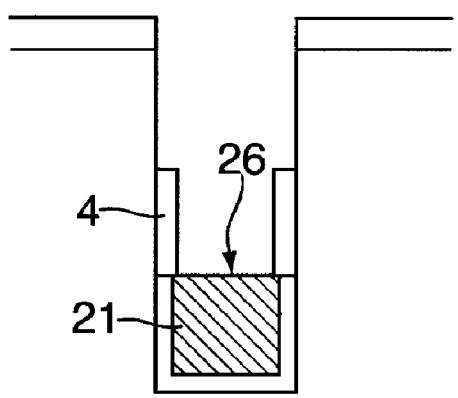
Figure 5D:
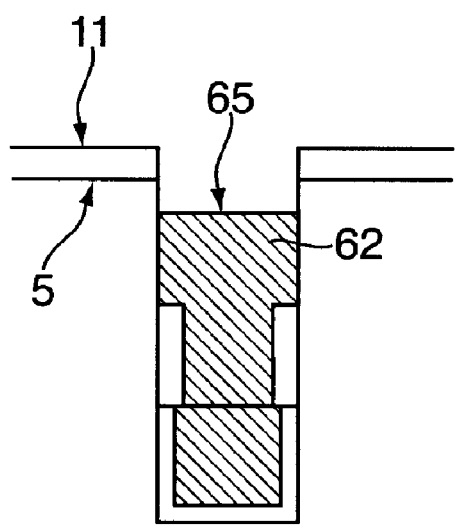

The remaining portion of the SOG is then removed in a process that is selective to the collar oxide. An example of such a process is a hydrofluoric acid wet etch, in which SOG can be etched more than 10 times faster than the collar oxide. The resulting structure is shown in FIG. 5C (compare FIG. 3C); removal of the SOG results in the top surface 26 of the node polysilicon being exposed. A second polysilicon deposition process is then performed, covering the substrate and filling the trench with a second polysilicon material. This polysilicon is planarized and etched so that it is recessed within the trench, as in the first embodiment; the resulting structure is shown in FIG. 5D (compare FIG. 3D).

It is noteworthy that when the polysilicon material is etched in a RIE process, the material may be both removed from the top surface 11 and also recessed in the trench in the same process. This effectively combines planarization of the blanket polysilicon layer and recessing inside the trench into a single step.

As in the first embodiment, the STI 40 is then formed, covering the top surface 65 of polysilicon 62 and overlapping the upper portion of the trench capacitor, as shown in FIG. 4. The transistor 50 is subsequently formed, along with the buried strap 55 connecting the upper portion of polysilicon 62 with source region 52 of the transistor.

The trench capacitor of FIG. 4 may thus be formed according to either of the two embodiments described above.

Figure 2:
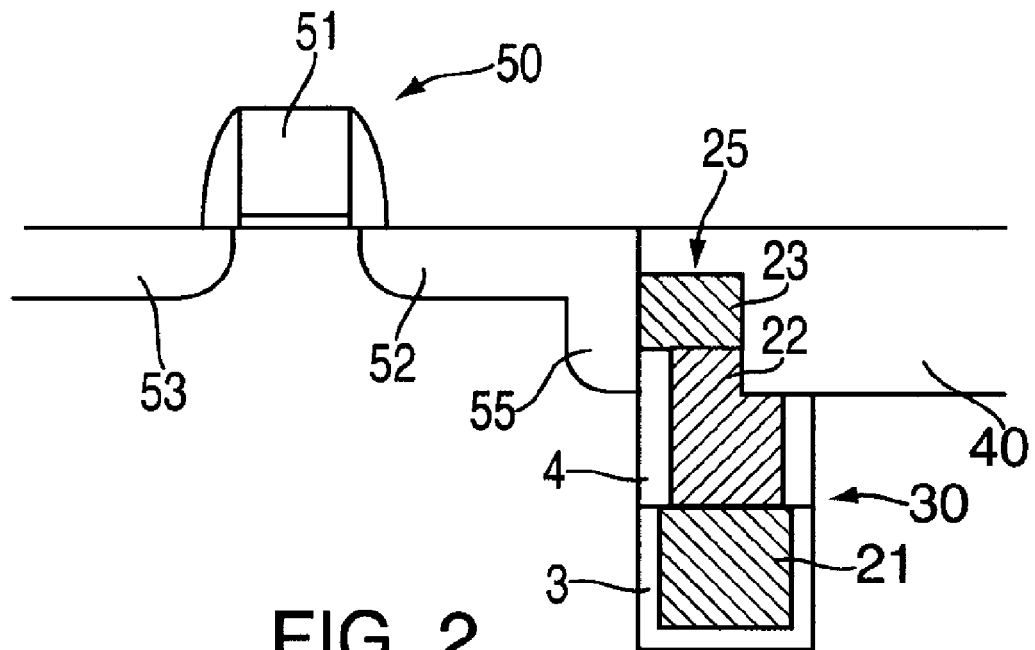
FIG. 2 schematically illustrates a completed DRAM cell including a transistor and trench capacitor, with the trench capacitor formed according to the conventional process of FIGS. 1A–1H.

A comparison of FIGS. 2 and 4 shows that a trench capacitor formed according to the present invention has two regions of polysilicon 21, 62 instead of three regions 21, 22, 23 as in the conventional trench capacitor. The trench capacitor formed according to the invention therefore has only one polysilicon/polysilicon interface instead of two in the conventional trench capacitor. It will be appreciated that, compared to the conventional trench capacitor formation process, a polysilicon deposition step and a planarization step are eliminated. The total process time and cost are accordingly reduced. Furthermore, the elimination of one polysilicon/polysilicon interface reduces the overall polysilicon resistance in the trench, thereby permitting improved device performance.

While the present invention has been described in conjunction with specific preferred embodiments, it would be apparent to those skilled in the art that many alternatives, modifications and variations can be made without departing from the scope and spirit of the invention. Accordingly, the invention is intended to encompass all such alternatives, modifications and variations which fall within the scope and spirit of the invention and the following claims.

What is claimed is:

1. A method for forming a trench capacitor in a semiconductor device, the trench being formed in a substrate having a surface, the method comprising the steps of:
    forming the trench in the substrate, the trench having sidewalls and a bottom;
    forming a first region of a first material in a bottom portion of the trench, the first region having an upper surface below the surface of the substrate, the first material being a first conducting material;
    subsequently forming a collar structure of dielectric material on a portion of the trench sidewalls above the upper surface of the first region;
    providing a removable material in the trench overlying the first material and in contact with a lower portion of the collar structure;
    removing an upper portion of the collar structure;
    removing the removable material so that the upper surface of the first region is exposed; and
    forming a second region of a second material overlying the first region and in contact therewith, the second region having an upper surface below the surface of the substrate,
    wherein the removable material is spin-on glass (SOG).

2. A method according to claim 1, wherein the first material and the second material are each polysilicon.

3. A method according to claim 1, wherein said step of removing the upper portion of the collar structure further comprises recessing the SOG inside the trench.

4. A method according to claim 3, wherein the upper portion of the collar structure is removed and the SOG is recessed in the trench in the same process.

5. A method according to claim 3, wherein the upper portion of the collar structure is removed and the SOG is recessed in the trench by a RIE process using a chemistry including at least one of $C_5F_8$, $C_4F_6$ and $CF_4$.

6. A method according to claim 1, wherein the SOG is removed in a wet etch process selective to the collar structure.

7. A method according to claim 6, wherein the wet etch process is performed using an etchant including hydrofluoric acid.

8. A method according to claim 1, wherein said step of forming the first region further comprises forming a layer of dielectric material separating the first conducting material from the bottom of the trench and from a lower portion of the trench sidewalls.

9. A method according to claim 1, wherein in said step of removing the upper portion of the collar structure a portion of the collar structure extending above the removable material is removed.

10. A method according to claim 9, wherein in said step of forming the second region, the second region extends above a remaining portion of the collar structure.

11. A method according to claim 1, wherein the upper portion of the second region is in contact with a conducting region of the substrate at a sidewall of the trench, and said conducting region is electrically connected to a transistor, so that the trench capacitor and the transistor form a DRAM cell.

12. A method according to claim 1, further comprising forming an isolation region in at least a region of the trench above the upper surface of the second region.

13. A method according to claim 1, wherein an interface is formed between the first region of the first material and the second region of the second material, said interface being the only interface formed between conducting materials in the trench.

14. A method according to claim 1, wherein
    said step of forming the first region further comprises depositing the first material both in the trench and on the substrate,
    said step of forming the second region further comprises depositing the second material both in the trench and on the substrate, and
    at least one of the first material and the second material above the surface of the substrate is removed by chemical-mechanical polishing.

15. A method according to claim 1, wherein
    said step of forming the first region further comprises depositing the first material both in the trench and on the substrate,
    said step of forming the second region further comprises depositing the second material both in the trench and on the substrate, and
    at least one of the first material and the second material above the surface of the substrate is removed by a plasma etch process.

16. A method according to claim 1, wherein
    said step of forming the first region further comprises depositing the first material both in the trench and on the substrate,
    said step of forming the second region further comprises depositing the second material both in the trench and on the substrate, and
    at least one of the first material and the second material is both removed above the surface of the substrate and recessed in the trench by the same process, said process being a RIE process.

* * * * *